United States Patent [19]

Santin et al.

[11] Patent Number: 5,411,908
[45] Date of Patent: May 2, 1995

[54] FLASH EEPROM ARRAY WITH P-TANK INSULATED FROM SUBSTRATE BY DEEP N-TANK

[75] Inventors: Giovanni Santin, S. Rufina; Giovanni Naso, Frosinone, both of Italy; Sebastiano D'Arrigo, Cannes, France; Michael C. Smayling, Missouri City, Tex.

[73] Assignee: Texas Instrument Incorporated, Dallas, Tex.

[21] Appl. No.: 890,577

[22] Filed: May 28, 1992

[51] Int. Cl.$^6$ .............................................. H01L 21/70
[52] U.S. Cl. ........................................ 437/52; 437/48; 437/43
[58] Field of Search ..................... 437/26, 43, 48, 52, 437/54, 56, 57

[56] References Cited

U.S. PATENT DOCUMENTS

| | | | |
|---|---|---|---|
| 4,451,905 | 5/1984 | Moyer | 365/185 |
| 4,784,966 | 11/1988 | Chen | 437/50 |
| 5,225,700 | 7/1993 | Smayling | 437/43 |
| 5,238,860 | 8/1993 | Sawada et al. | 437/57 |
| 5,243,559 | 9/1993 | Murai | 365/185 |

*Primary Examiner*—Tom Thomas
*Attorney, Agent, or Firm*—Theodore D. Lindgren; Leo N. Heiting; Richard L. Donaldson

[57] ABSTRACT

In accordance with one embodiment of the invention, a nonvolatile memory array is encased in a P-tank, and the P-tank encased in a deep N-tank, the two tanks separating the memory array from the substrate and from the other circuitry of the integrated memory circuit. The deep N-tank allows application of a negative voltage of perhaps −8 V to the P-tank encasing the memory array. Application of that negative voltage permits the cells of the memory array to be programmed with voltage pulses having a peak value of about +10 V, rather than the +18 V peak value of prior-art memory arrays. Because the external circuitry, such as the wordline driver circuit, need drive the wordlines at +10 V rather than +18 V, the invention permits construction of that external circuitry using thinner gate insulators and space-saving shorter dimensions.

8 Claims, 5 Drawing Sheets

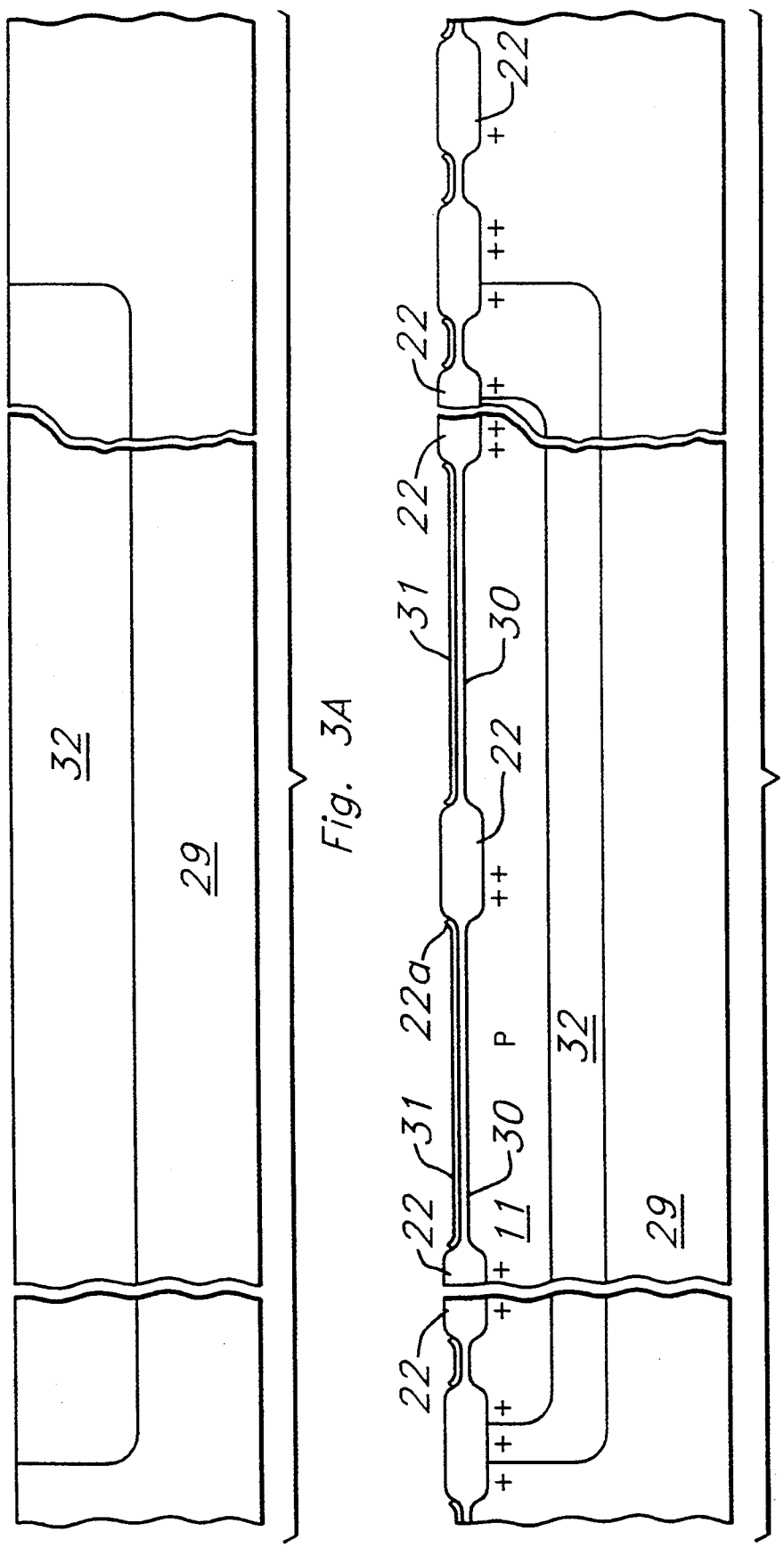

FLASH EEPROM ARRAY WITH P-TANK INSULATED FROM SUBSTRATE BY DEEP N-TANK

NOTICE

Copyright © 1992 Texas Instruments Incorporated. A portion of this patent document contains material that is subject to copyright protection. Texas Instruments Incorporated has no objection to the facsimile reproduction of the issued patent or of those documents in the Patent and Trademark Office file pertaining to the issued patent. All other copyright rights are reserved.

BACKGROUND OF THE INVENTION

This invention relates to nonvolatile semiconductor memory devices and, more particularly, to electrically-erasable, electrically-programmable, read-only memories (EEPROMs) having floating-gate-type memory cells and to a method for making such devices.

Currently available nonvolatile memories require a programming voltage of about +18 V to write data into the floating gates of memory cells. In particular, a voltage pulse having a peak value of about +18 V is applied to the control gate of a cell during programming while the source of the cell is at 0 V. Application of the +18 V to the control gate causes unnecessarily high electric field stresses in circuits external to the memory array, such as the wordline driver circuitry.

There is a need for a nonvolatile memory array that permits the circuitry outside of the memory array to be constructed for use at lower voltages and decreased electric field stress. Such an array would allow external circuitry, such as wordline driver circuits, to be built with thinner gate oxides and with smaller dimensions, if operated at lower voltages. The smaller dimensions would allow a decrease in the size of the external circuitry to correspond to the continuing decrease in the size of memory cells.

SUMMARY OF THE INVENTION

In accordance with one embodiment of the invention, a nonvolatile memory array is encased in a P-tank, and the P-tank encased in a deep N-tank, the two tanks separating the memory array from the substrate and from the other circuitry of the integrated memory circuit. The deep N-tank allows application of a negative voltage of perhaps −8 V to the P-tank encasing the memory array. Application of that negative voltage permits the cells of the memory array to be programmed with voltage pulses having a peak value of perhaps +10 V, rather than the +18 V peak value of prior-art memory arrays. Because the external circuitry, such as the wordline driver circuit, need drive the wordlines at only +10 V rather than +18 V, the invention permits construction of that external circuitry using thinner gate insulators and space-saving shorter dimensions.

The term "tank" as used herein refers to a diffusion region formed in a semiconductor substrate. Such diffusion regions are sometimes referred to as "tubs" or as a "wells".

BRIEF DESCRIPTION OF THE DRAWINGS

In the drawings:

FIGS. 3A–3F are elevation views in section of the semiconductor device of FIG. 2, taken along the line a—a of FIG. 2 at various stages of construction; and FIG. 4 is an elevation view in section of the semiconductor device of FIG. 2, taken along the line d—d of FIG. 2.

DETAILED DESCRIPTION OF SPECIFIC EMBODIMENT

Figure 1:
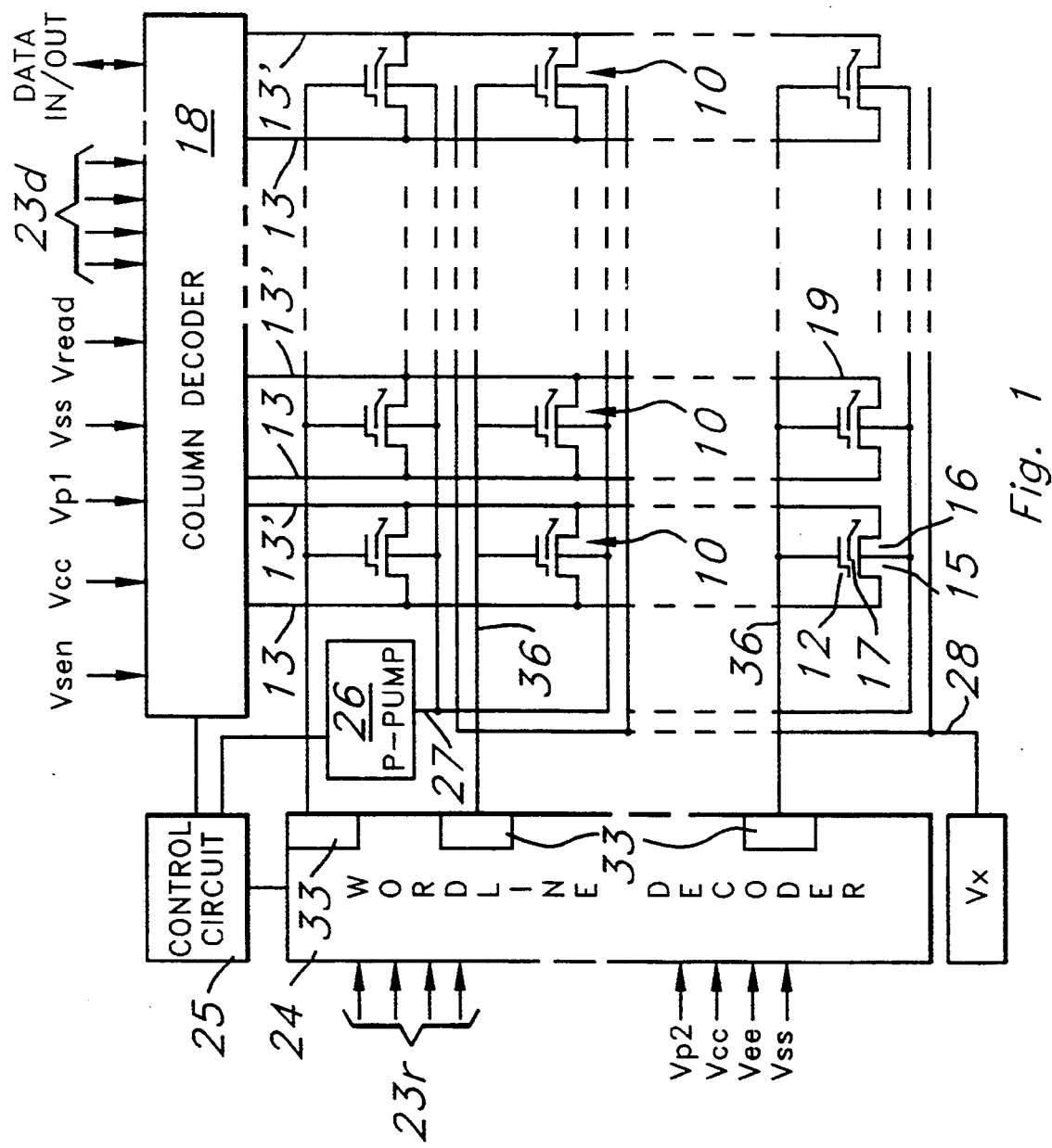
FIG. 1 is a representation of an array of memory cells and associated circuitry according to this invention.

Referring to FIG. 1, an example array of integrated-circuit memory cells is shown for the purpose of illustrating use of this invention. Each cell is a floating-gate transistor 10 having a control gate 12, a source 15, a drain 16 and a floating gate 17. A control gate 12 of each cell 10 in a row is connected to a wordline 36, and each of the wordlines 36 is connected to a wordline decoder 24, which includes wordline driver circuits 33. A source 15 of each cell 10 in a column is connected to a column line 13, and each of those column lines 13 is connected to a column decoder 18. A drain 16 of each cell 10 in a column is connected to a column line 13, and each of those column lines 13 is also connected to the column decoder 18. Address signals are transmitted to the wordline decoder 24 at terminals 23r and to the column decoder 18 at terminals 23d. The wordline decoder 24 and the column decoder 18 are controlled by a control circuit 25, which may be a part of a microprocessor physically located on another integrated circuit chip. P-tank charge pump 26 is controlled by control circuit 25 and is connected by terminal 27 to a region of the chip. As will be described later, terminal 27 is connected to a P-tank that is contained by a N-tank. As will also be described later, terminal 28 is connected to the N-tank. Terminal 28 is also connected to a voltage Vx, which may be the supply voltage Vcc, for example.

During a flash-erase mode, the column decoder 18 functions, for example, to apply a positive voltage Vcc (approximately +5 volts) to all of those column lines 13 that are connected to sources 15. The column decoder 18 also functions to leave floating all of those column lines 13 that are connected to drains 16. The wordline decoder 24 functions to cause the wordline driver circuits 33 to apply a high negative voltage Vee (approximately −11 volts) to all of the wordlines 36. P-tank charge pump 26 applies 0 V to terminal 27. N-tank terminal 28 is connected to a voltage Vx of perhaps +5 V (which may be the supply voltage Vcc). The applied voltages erase programmed cells 10 by removing excess electrons from the floating gates 17.

In the read mode, the wordline decoder 24 functions, in response to wordline address signals on lines 23r and to a signal from read/write/erase control circuit 25, to cause a wordline driver circuit 33 to apply a preselected positive voltage Vread (perhaps +3.5 V) to the selected wordline 36 (and the selected control gate 12), and to cause the other wordline drive circuits 33 to apply a low voltage (Vss or 0 V) to deselected wordlines 36. The column decoder 18 functions, in response to column address signals on lines 23d, to apply a preselected positive voltage Vsen (perhaps 1.5 V) to that column line 13 connected to the drain 16 of the selected cell 10. The column decoder 18 also functions to connect those column lines 13 connected to sources 15 to ground (Vss or 0 V). The output of P-tank charge pump 26 is switched to apply a voltage of 0 V (Vss) to terminal 27. N-tank terminal 28 is connected to a voltage source of perhaps +5 V (Vcc). The conductive or nonconductive state of the cell 10 connected by column line 13 to the drain 16 of the selected cell 10 and to wordline 36 of that selected cell 10 is detected by a sense amplifier (not shown) connected to the DATA OUT terminal.

In a basic write or program mode, P-tank charge pump 26 applies a voltage Vbl of −8 V to terminal 27. A voltage Vx of perhaps +5 V (Vcc) is applied to terminal 28. Column decoder 18, in response to signals on lines 23d and to a signal from control circuit 25, functions to place voltage Vp1 of about −8 V on the column line 13 connected to the source 15 of the selected cell 10. The wordline decoder 24 functions, in response to wordline address signals on lines 23r and to a signal from control circuit 25, to cause wordline driver circuits 33 to place a voltage Vp2 of about +10 V on the selected wordline 36 connected to the selected cell 10, including the control gate 12 of the selected cell 10. The difference between Vp1 and Vp2 must be of sufficient magnitude that excess electrons will migrate, perhaps by Fowler-Nordheim tunnelling, to the selected floating-gate 17 and, as a result, program the selected floating-gate 17.

For convenience, a table of read, write and erase voltages is given in table I below:

TABLE 1

|  | Read | Write | Flash Erase |
| --- | --- | --- | --- |
| Selected Wordline | 3.5 V | 10 V | −10 V (All) |
| Deselected Wordlines | 0 V | 0 V | — |
| Selected Source Line | 1.5 V | −8 V | 5 V (All) |
| Deselected Source Line | Float | 0 V | — |
| Selected Drain Line | 0 V | Float | Float (All) |
| Deselected Drain Lines | 0 V | Float | — |
| P-tank | 0 V | −8 V | 0 V |
| N-tank | 5 V | 5 V | 5 V |

Figure 2:
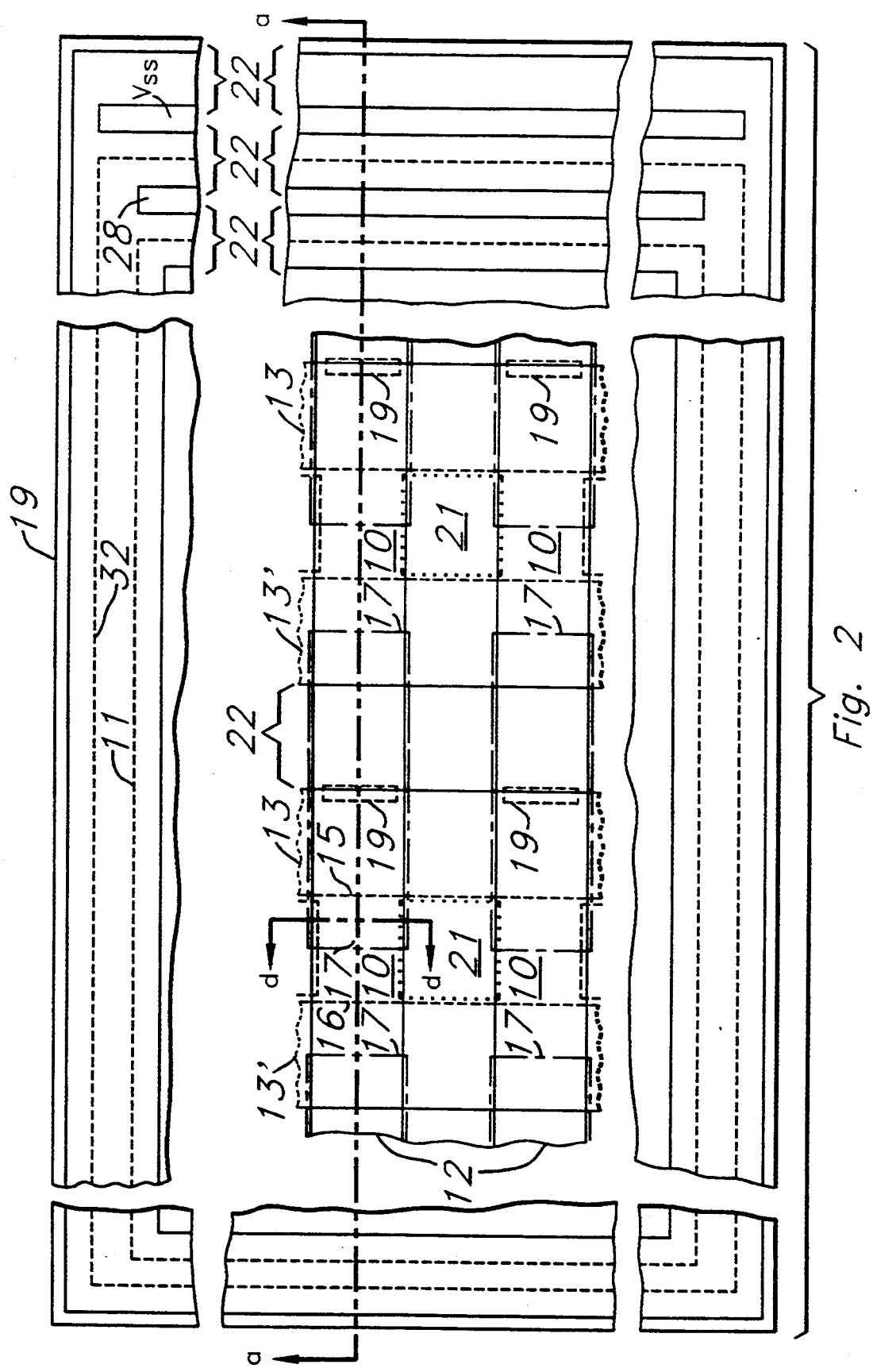
FIG. 2 is a plan view of a part of a semiconductor chip having memory cells according to one embodiment.
Figure 3C:
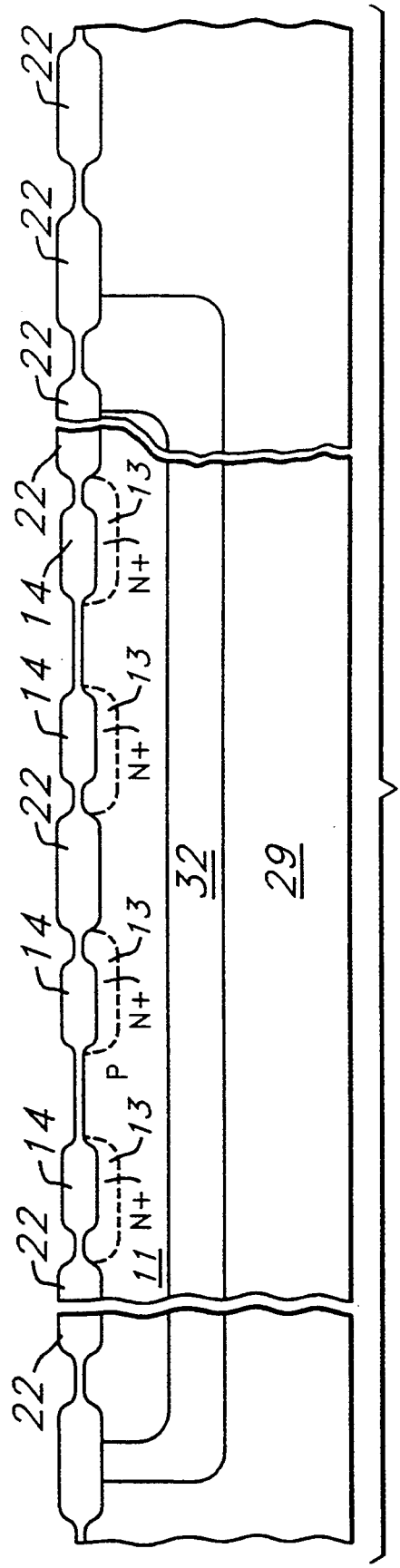
Figure 3D:
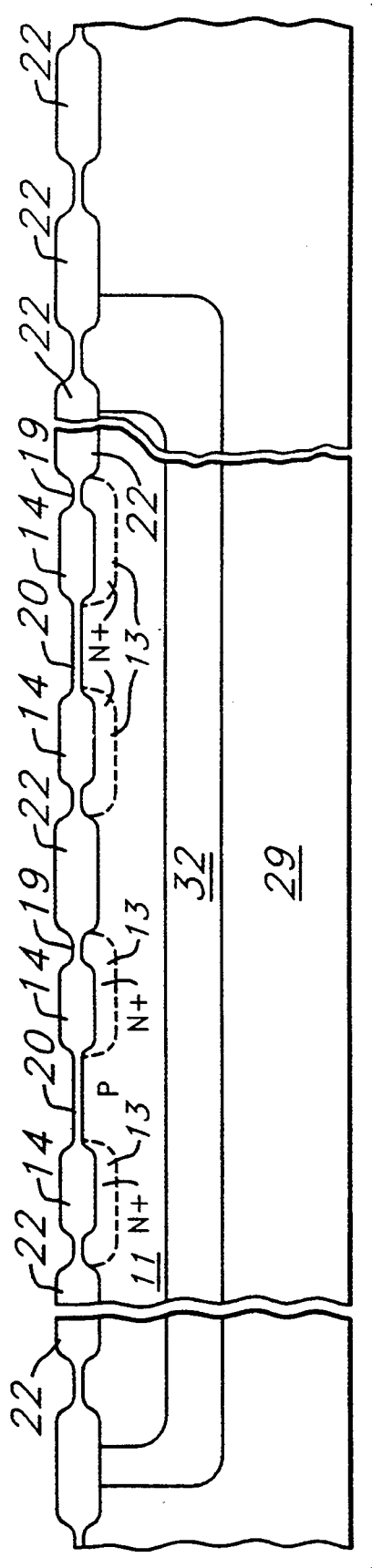
Figure 3E:
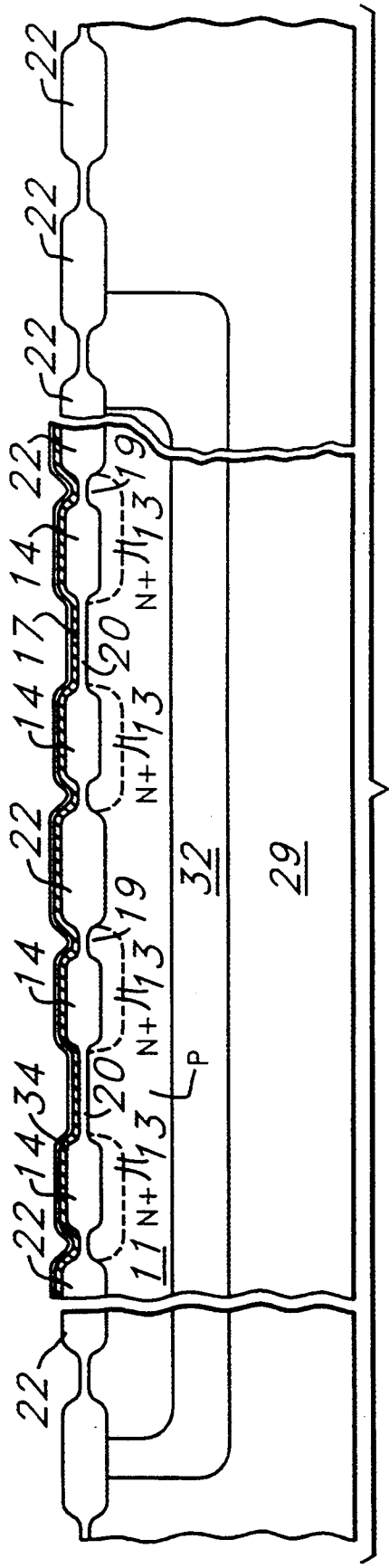
Figure 3F:
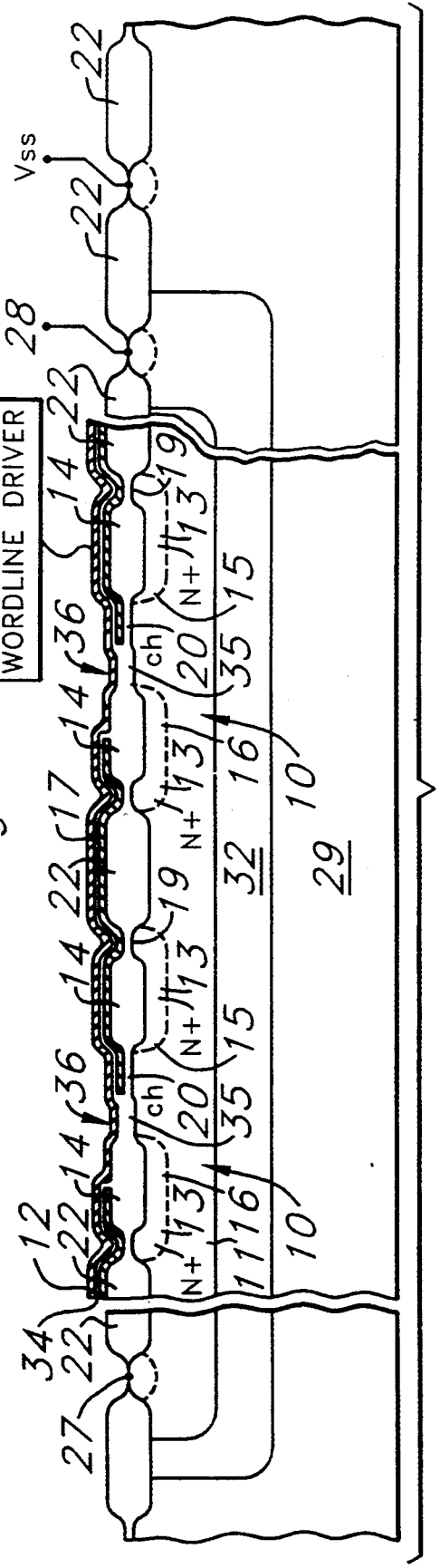

Referring now to FIGS. 2 and 3F, an array of electrically-erasable, electrically-programmable memory cells 10 is shown formed in a face of a silicon substrate 29. Only a very small part of the substrate 29 is shown in the FIGS., it being understood that cells 10 are part of an array of a very large number of such cells. A number of wordlines 36/control gates 12 are formed by second-level polycrystalline silicon (polysilicon) strips 36 extending along the face of the substrate 29, and column lines 13 are formed beneath thick thermal silicon oxide layers 14 in the face. These buried column lines 13 include the source 15 and the drain 16 for each of the cells 10. A floating gate 17 for each cell 10 is formed by a first-level polysilicon layer extending across about half of a cell 10 and across one column line 13 and extending over onto another adjacent column line 13 Two "horizontal", or X-direction, edges of the floating gate 17 are aligned with the edges of a wordline 36.

A tunnel window 19 for programming and erasure is shown adjacent a column line 13 connected to each cell 10, on the opposite side of the source 15 of each cell 10. The silicon oxide at this tunnel window 19 is thinner, about 100 A, compared to the dielectric coatings 35 and 20 of about 350 A and 500 A at the two parts of the channel Ch between source 15 and drain 16. Programming and erasing can be performed at relatively low externally-applied voltages using this structure.

A thick field oxide area 22 is used to isolate cells 10 from one another in the Y-direction. Strips 22 of LOCOS thick field oxide separate column lines 13 between cells 10 in the X-direction. Note that the example array of cells 10 is not of the "virtual-ground-circuit" type; that is, there are two column lines 13 each column (Y-direction) of cells 10.

A method of making the device of FIGS. 2, 3F and 4 will be described in reference to FIGS. 3A-3F. The starting material is a slice of P-type silicon of which the substrate 29 is only a very small portion. The slice is perhaps 6 inches in diameter, while the portion shown in FIG. 2 is very small fraction of that slice. A number of process steps are performed to create transistors peripheral to the memory array, and those steps are not discussed here.

Referring now to FIG. 3A, a deep N-tank 32 is formed in the substrate 29 using the following process. An oxide layer and a nitride layer (not shown) are grown on the surface of substrate 29. The nitride layer is then patterned and etched to define the area or areas in which the deep N-tank 32 implant is to occur. The length and the width the implant area must be sufficiently large that the corresponding dimensions of the memory array (or sub array) encase a P-tank which in turn encases the memory array. The N-tank implant is then conducted, preferably with phosphorous at a dose of about $2.5 \times 10^{12}$ ions/cm$^2$ and at an energy level of about 80 KeV. An anneal of the N-tank dopant is performed at high temperature, perhaps 1200° C. for 700 minutes in a nitrogen atmosphere, to form a junction deeper than 2 microns. This creates deep (N-) tank region 32.

Referring now to FIG. 3B, P-tank 11 is formed in the N-tank 32. The P-tank 11 is patterned with a photoresist layer (not shown) and a P-type implant is performed, preferably with boron at a dose of about $2.5 \times 10^{12}$ ions/cm$^2$ and an energy of approximately 40 KeV. The length and width of the pattern must be sufficiently small to allow the P-tank 11 to be encased by the deep N-tank 32, but sufficiently large to encase the memory array (or sub-array). This implantation causes the creation of the channel Ch regions of the memory cells 10 and any other field effect transistors included in the memory array. The photoresist layer then stripped.

Additional patterned N- and P- implants of phosphorous and boron are performed for low-voltage transistor-tank regions. These implants are performed, for example, at $8 \times 10^{12}$ ions/cm$^2$ at an energy of 80 KeV and at $1.5 \times 10^{12}$ ions/cm$^2$ at an energy of 40 KeV, respectively. All tank dopants are driven in a second anneal at perhaps 1100° C. for 500 minutes in a nitrogen atmosphere.

Active regions are defined by a conventional LOCOS process. Oxide is grown, then nitride deposited to serve as a diffusion barrier. The nitride is patterned and etched where isolation oxide will be grown.

As also illustrated in FIG. 3B, a channel-stop implant is performed. To protect areas of the substrate 29 and P-tank 11 surface from exposure to doping, a photoresist layer (not shown) is patterned to define lateral edges of the channel stop regions. The pattern excludes implants in N-tanks for switching transistors, and the LOCOS nitride excludes implants where the active regions will be. The channel stop implant is performed, for example, with a (P) type dopant such as boron at a dose of about $3 \times 10^{13}$ ions/cm$^2$ and at an energy of about 30 KeV. The implant produces the channel stop regions represented by the pluses 37 in FIG. 3C. The channel stop regions 37 have been omitted from the subsequent sectional views shown in FIGS. 3C-3F for the purposes of clarity. The channel stop 37 implant acts to augment the conductivity type of the P-tank 11 in the implanted channel stop regions 37. It also prevents the formation of parasitic transistor between the devices. Channel stop may also be implanted at this time in regions 21 shown in FIGS. 2 and 4. Channel stop areas are also created at the substrate 29 surface junctions of deep N-tank 32 and substrate 29 as well as at the substrate 29 surface junctions of P-tank 11 and deep N-tank 32. An additional channel stop opening is shown for electrical connection to the substrate 29. The photoresist layer is subsequently ashed and cleaned from the surface of substrate 29.

Referring again to FIG. 3B, further processing under the channel stop step are described. Isolating oxide regions 21 (shown in FIGS. 2 and 4) and 22 are grown by localized oxidation (LOCOS) to about 7600 Angstroms in thickness (the thicknesses of the sections shown in FIGS. 3B-3F not being to scale). The growth occurs under an oxidizing atmosphere such as steam for about nine to ten hours at about 900° C. The oxidation occurs in those areas left open by the nitride/oxide mask 31 shown in FIG. 3B. The thermal oxide grows beneath the edges of the mask 31, creating a "bird's beak" 22a instead of a sharp transition. The oxide portion of masking layer 31 is removed in a hydrofluoric acid dip for two minutes, and the nitride portion of layer 31 is removed in a hot phosphoric acid solution at about 185° C. for about 50 minutes.

After a cleanup step, a dummy oxide layer (not shown) is grown on the exposed silicon surface to remove damaged material. This dummy oxide layer is subsequently stripped with a hydrofluoric acid wet etch.

Turning now to FIG. 3C, an arsenic implant is performed at a dosage of about $6 \times 10^{15}$ ions/cm$^2$ at 135 KeV, using photoresist as an implant mask, to create the sources 15, drains 16 and column lines 13. Next, another thermal oxide 14 is grown on the face to a thickness of about 2500 to 3500 A over the N+ buried column lines 13, during which time a thermal oxide of perhaps 300 A will grow over the channel areas (due to the differential oxidation occurring when heavily-doped and lightly-doped silicon areas are exposed to oxidation at the same time), to create the oxide layers 14 above the sources 15 and drains 16 and source-column lines 13. This oxidation is in steam at about 800° to 900° C. At the transition areas 19 where the bird's beak 22a has been formed, the edge of the originally-formed thermal oxide has masked the arsenic implant so the concentration is lower and so the oxide growth in that area is less than that of the oxide 14 or the oxide 22.

Referring to FIG. 3D, windows 19 are opened in the oxide in one of the transition area between oxides 14 and 22 for each cell 10. This is done using photoresist as a mask, and etching through the oxide of transition area to the bare silicon, then regrowing a thinner oxide for the tunnel window 19. During oxidation of tunnel window 19, gate oxide 20 will grow to approximately 350 A. A light phosphorus implant in the tunnel window 19 is used for enhanced field plate breakdown voltage.

Turning now to FIG. 3E, a first polysilicon layer 17, doped N+, is now applied to the face of the silicon slice, and an inter-level insulator coating 34 of oxide, or oxide-nitride-oxide, is applied to the polysilicon layer 17.

The first-level polysilicon and the inter-level insulator are defined using photoresist to leave elongated strips in the Y-direction, parts of which will become the floating gates 17. An oxidation, performed after the first-level polysilicon is defined, covers the edges of first-level polysilicon, and also creates the gate oxides 35 where the wordline 36 control conduction of the channel Ch. An additional patterned oxidation is performed for the low-voltage transistors.

Referring now to FIG. 3F, a second polysilicon layer is deposited, doped N+, and patterned using photoresist to create the wordlines 36/control gates 12. At the same time as the wordlines 36/control gates 12 are defined, the edges of the first-level polysilicon are etched, so that the elongated X-direction edges of the floating gates 17 are self-aligned with the edges of the control gates 12. It should be noted that the FIGS. are not drawn to scale and that, in particular, the thicknesses of the first and second polysilicon layers are generally much greater than the thicknesses of oxide layers 20 and 35.

Peripheral logic CMOS devices, including wordline driver circuits 33, are completed at this step. The wordline driver circuit may, for example, be constructed in the manner described in U.S. Pat. No. 4,823,318 issued Apr. 18, 1989 and assigned to Texas Instruments Incorporated. In general, such peripheral circuits will be located on the chip outside of deep N-tank 32.

An oxide layer may be grown or formed after this process on the sides and top of the stack for improved data retention. A borophosphosilicate glass (BPSG) layer (not shown) may then be deposited over the face of the slice. Following the BPSG deposition, the substrate 29 is heated again at 850° to 900° C. in an annealing ambient to provide BPSG densification, repair implant damage and further junction profile drive. Off-array contacts may be made through the BPSG layer, as well as on-array contacts that are made from metal lines to respective diffused regions, such as terminals 27 and 28 and the substrate terminal indicated Vss. This is followed by a protective overcoat process.

The exemplary cell array is also described in U.S. Pat. No. 5,008,721 issued Apr. 16, 1991 and assigned to Texas Instruments Incorporated. The invention described herein is, of course, usable with many other types of floating-gate memory cell arrays.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments that fall within the true scope of the invention.

We claim:

1. A method for making a nonvolatile, floating-gate memory in a face of a semiconductor body of a first conductivity-type, comprising the steps of:

forming a first diffusion region in said semiconductor body, said first diffusion region doped to have a second conductivity-type opposite said first conductivity-type;

forming a second diffusion region in said first diffusion region and in said semiconductor body, said second diffusion region doped to have said first conductivity-type;

forming an array of floating-gate memory cells in and on said second diffusion region; and forming wordline driver circuitry in and on said semiconductor body outside of said first diffusion region.

2. The method according to claim 1, wherein said semiconductor body is silicon of P conductivity-type, said first diffusion region is of N conductivity-type and said second diffusion region is of P conductivity type.

3. The method according to claim 1 further including said semiconductor body having a first potential, wherein said first diffusion region is connected to a non-negative potential with respect to said first potential.

4. The method according to claim 1, wherein said floating-gate memory has a primary power supply and wherein said first diffusion region is connected to said primary power supply.

5. The method according to claim 1 further including said semiconductor body having a first potential, wherein during programming operation, said second diffusion region is connected to a source of second potential that is negative with respect to said first potential.

6. The method according to claim 1, wherein during programming operation, said second diffusion region is connected to a charge pump voltage supply having an output voltage that is negative with respect to the voltage of said semiconductor body.

7. The method according to claim 1, wherein Fowler-Nordheim tunnelling is used to program said floating gates of memory cells.

8. The method according to claim 1, wherein said wordline driver circuitry operates at a maximum voltage less than the voltage required to program said floating-gate memory.

* * * * *